(12) United States Patent
Zhao (10) Patent No.: US 12,016,253 B2
(45) Date of Patent: Jun. 18, 2024

(54) QUANTUM CHIP TEST STRUCTURE AND FABRICATION METHOD THEREFOR, AND TEST METHOD AND FABRICATION METHOD FOR QUANTUM CHIP

(71) Applicant: Origin Quantum Computing Technology (Hefei) Co., Ltd, Hefei (CN)

(72) Inventor: Yongjie Zhao, Hefei (CN)

(73) Assignee: Origin Quantum Computing Technology (Hefei) Co., Ltd, Hefei (CN)

( * ) Notice: Subject to any disclaimer, the term of this patent is extended or adjusted under 35 U.S.C. 154(b) by 0 days.

(21) Appl. No.: 18/315,378

(22) Filed: May 10, 2023

(65) Prior Publication Data
US 2023/0345843 A1    Oct. 26, 2023

Related U.S. Application Data
(63) Continuation of application No. PCT/CN2021/140194, filed on Dec. 21, 2021.

(30) Foreign Application Priority Data

Dec. 29, 2020    (CN) .......................... 202011591315.X (51) Int. Cl.
    *H10N 60/12*    (2023.01)
    *G06N 10/40*    (2022.01)
    (Continued)

(52) U.S. Cl.
    CPC ............. *H10N 60/12* (2023.02); *G06N 10/40* (2022.01); *H01L 22/14* (2013.01);
    (Continued)

(58) Field of Classification Search
    CPC . H10N 60/12; H10N 60/0912; G01R 31/2886
    See application file for complete search history.

(56) References Cited

U.S. PATENT DOCUMENTS 5,821,556 A    10/1998    Chew et al.
6,024,713 A    2/2000    Barney
(Continued)

FOREIGN PATENT DOCUMENTS

CN    1202730 A    12/1998
CN    101059556 A    10/2007
(Continued)

OTHER PUBLICATIONS

Cao et al., Design and application of measurement stage for josephson junction characteristics, Chinese Journal of Scientific Instrument, vol. 32, No. 6, pp. 223-225, dated Jun. 30, 2011.
(Continued)

*Primary Examiner* — Matthew L Reames
(74) *Attorney, Agent, or Firm* — Westbridge IP LLC (57) ABSTRACT

Disclosed are a quantum chip test structure and a fabrication method therefor, and a test method and a fabrication method for a quantum chip. The quantum chip test structure includes: a superconducting Josephson junction and a connection structure of the superconducting Josephson junction that are located on a substrate; a first isolation layer located on the connection structure, where a connection window penetrating through the first isolation layer is formed in the first isolation layer; a second isolation layer located on the first isolation layer, where a deposition window is formed in the second isolation layer; and an electrical connection portion located in the connection window and an electrical connection layer located in the deposition window, and the electrical connection layer is configured to implement electrical contact with a test device.

16 Claims, 6 Drawing Sheets

(51) Int. Cl.
  *H01L 21/66* (2006.01)
  *H10N 60/01* (2023.01)
  *H10N 60/80* (2023.01)
  *H10N 69/00* (2023.01)

(52) U.S. Cl.
  CPC ..... *H10N 60/0156* (2023.02); *H10N 60/0912* (2023.02); *H10N 60/805* (2023.02); *H10N 69/00* (2023.02)

(56) References Cited

U.S. PATENT DOCUMENTS

| | | | |
|---|---|---|---|
| 2003/0068832 A1 | 4/2003 | Koval et al. | |
| 2006/0097386 A1 | 5/2006 | Ertle et al. | |
| 2017/0072504 A1 | 3/2017 | Abraham et al. | |
| 2019/0109273 A1 | 4/2019 | Abraham et al. | |
| 2022/0123195 A1* | 4/2022 | Adiga | H10N 60/805 |

FOREIGN PATENT DOCUMENTS

| | | |
|---|---|---|
| CN | 106298565 A | 1/2017 |
| CN | 109148362 A | 1/2019 |
| CN | 111505478 A | 8/2020 |
| CN | 111554798 A | 8/2020 |
| CN | 111933787 A | 11/2020 |
| CN | 112782557 A | 5/2021 |
| CN | 113325293 A | 8/2021 |
| JP | H02199849 A | 8/1990 |
| JP | H07288345 A | 10/1995 |
| KR | 20030071300 A | 9/2003 |
| WO | 2012011207 A1 | 1/2012 |

OTHER PUBLICATIONS

International Search Report issued in corresponding PCT Application No. PCT/CN2021/140194, dated Mar. 9, 2022.
Notification to Grant Patent Right for Invention issued in counterpart Chinese Patent Application No. 202011591315.X, dated Aug. 8, 2021.
Written Opinion issued in corresponding PCT Application No. PCT/CN2021/140194, dated Mar. 9, 2022.
Zhai, Research on Josephson Junction (Array) Testing System, Master Thesis submitted to the Qingdao University, dated May 30, 2014.
European Search Report issued in counterpart European Patent Application No. EP 21914048.0, dated Feb. 20, 2024.

* cited by examiner

```
┌─────────────────────────────────────────────────────────┐
│ Fabricating a superconducting Josephson junction and a  │ ─ S101
│ connection structure of the superconducting Josephson   │
│            junction on a substrate                      │
└─────────────────────────────────────────────────────────┘
                            │
                            ▼
┌─────────────────────────────────────────────────────────┐
│ Forming a first isolation layer on the connection       │ ─ S102
│ structure, and forming in the first isolation layer a   │
│ connection window penetrating through the first         │
│                 isolation layer                         │
└─────────────────────────────────────────────────────────┘
                            │
                            ▼
┌─────────────────────────────────────────────────────────┐
│ Forming a second isolation layer on the first isolation │ ─ S103
│ layer, and forming a deposition window in the second    │
│                  isolation layer                        │
└─────────────────────────────────────────────────────────┘
                            │
                            ▼
┌─────────────────────────────────────────────────────────┐
│ Forming an electrical connection portion in the         │ ─ S104
│ connection window and forming an electrical connection  │
│          layer in the deposition window                 │
└─────────────────────────────────────────────────────────┘
```

QUANTUM CHIP TEST STRUCTURE AND FABRICATION METHOD THEREFOR, AND TEST METHOD AND FABRICATION METHOD FOR QUANTUM CHIP

CROSS-REFERENCE TO RELATED APPLICATIONS

This application is a continuation of International Application No. PCT/CN2021/140194, filed on Dec. 21, 2021, which claims priority to Chinese Patent Application No. 202011591315.X, filed with the China National Intellectual Property Administration on Dec. 29, 2020 and entitled "QUANTUM CHIP TEST STRUCTURE AND FABRICATION METHOD AND TEST METHOD THEREFOR". The disclosures of the aforementioned applications are hereby incorporated by reference in their entireties.

TECHNICAL FIELD

The present application belongs to the field of quantum chip fabrication and detection, and more particularly, relates to a quantum chip test structure, a fabrication method for a quantum chip test structure, a test method for a quantum chip, and a fabrication method for a quantum chip.

BACKGROUND

A quantum chip is a core component of a quantum computer, and mainly includes a superconducting quantum chip, a semiconductor quantum chip, a quantum dot chip, an ion trap, an NV center (diamond), and the like. The quantum chip has at least one qubit, and each qubit includes a detector and a qubit apparatus that are coupled to each other. For a superconducting quantum chip, a qubit includes a ground capacitor, a closed-loop apparatus connected in parallel with the capacitor, and a control signal line. The closed-loop apparatus is constituted by Josephson junctions connected in parallel, where the Josephson junction, also referred to as a superconducting tunnel junction, is generally a structure formed by sandwiching a very thin barrier layer (thickness-≤coherence length of a Cooper electron pair) between two superconducting material layers, for example, a superconducting material layer (S)-semiconductor or insulator material layer (I)-superconducting material layer (S) structure, briefly referred to as SIS. Performance of superconducting qubits directly depends on performance quality of the Josephson junction, and therefore a test must be performed to confirm whether the Josephson junction is qualified or not.

According to conventional semiconductor testing schemes, testing includes non-contact testing and contact testing. For the non-contact testing, a superconducting quantum chip may include two types of superconducting Josephson junctions, one type is test junction and the other type is functional junction. The test junction is generally distributed at a corner of the chip, and if a test result of the test junction is passed, it is considered that the functional junction is also normal. However, this is based on the premise of mature technology and good consistency between the test junction and functional junction. However, fabrication of the superconducting quantum chip is different from that of the conventional semiconductor process, which results in that the stability of existing process cannot meet the standard, and a case that the test junction passes the test but actually the function junction is abnormal may occur. For the contact testing, due to structural sensitivity of the superconducting Josephson junction, slight microstructural damage may cause the superconducting Josephson junction to be abnormal, and thus it is commonly known that currently measurement cannot be performed by using an electrical contact method.

SUMMARY

The present application provides a quantum chip test structure, a fabrication method for a quantum chip test structure, a test method for a quantum chip, and a fabrication method for a quantum chip, to implement an electrical contact test on a superconducting Josephson junction, thereby at least solving a problem of failing to perform an electrical test on a superconducting Josephson junction by using an electrical contact method.

In some implementations of the present application, a quantum chip test structure is provided. The quantum chip test structure may include:
  a superconducting Josephson junction and a connection structure of the superconducting Josephson junction that are located on a substrate;
  a first isolation layer located on the connection structure, where a connection window penetrating through the first isolation layer is formed in the first isolation layer;
  a second isolation layer located on the first isolation layer, where a deposition window is formed in the second isolation layer, the deposition window is configured to define a deposition region that is located on the first isolation layer, and the connection window is connected to the deposition window; and
  an electrical connection portion located in the connection window and an electrical connection layer located in the deposition window, where the electrical connection portion has one end connected to the connection structure and the other end connected to the electrical connection layer, and the electrical connection layer is configured to implement electrical contact with a test device.

In some implementations of the foregoing test structure, the first isolation layer and the second isolation layer may be made of at least one of a photoresist and an electron beam resist.

In some implementations of the foregoing test structure, an undercut structure is formed in the deposition window, and a thickness of the electrical connection layer is less than that of the second isolation layer.

In some implementations of the foregoing test structure, the connection structure may be made of a superconducting material.

In some implementations of the foregoing test structure, the superconducting material may include one of TiN, Nb, Al or Ta.

In some implementations of the foregoing test structure, the electrical connection layer and the electrical connection portion are made of an easily peeling-off conductive material. In this way, the electrical connection layer and the electrical connection portion may be easily peeled off with respect to the connection structure.

In some implementations of the foregoing test structure, the easily peeling-off conductive material may include one of Al and Ze.

In some implementations of the foregoing test structure, the superconducting Josephson junction may be a structure formed by sandwiching an oxide film layer between two superconducting material layers.

In some implementations of the foregoing test structure, the connection structure may be an electrode formed integrally with the corresponding superconducting material layer or formed by extending the superconducting material layer, or the connection structure may be an electrical structure connected to the superconducting Josephson junction.

In some implementations of the foregoing test structure, the connection window may be a through hole formed in the first isolation layer, and one end of the through hole may extend to a surface of the connection structure.

In some implementations of the present application, a fabrication method for a quantum chip test structure is provided. The fabrication method for a quantum chip test structure may include:
- fabricating a superconducting Josephson junction and a connection structure of the superconducting Josephson junction on a substrate;
- forming a first isolation layer on the connection structure, and forming in the first isolation layer a connection window penetrating through the first isolation layer;
- forming a second isolation layer on the first isolation layer, and forming a deposition window in the second isolation layer, where the deposition window is configured to define a deposition region that is located on the first isolation layer, and the connection window is connected to the deposition window; and
- forming an electrical connection portion in the connection window and forming an electrical connection layer in the deposition window, where the electrical connection portion has one end connected to the connection structure and the other end connected to the electrical connection layer, and the electrical connection layer is configured to implement electrical contact with a test device.

In some implementations of the foregoing fabrication method, the first isolation layer and the second isolation layer may be made of at least one of a photoresist and an electron beam resist.

In some implementations of the foregoing fabrication method, an undercut structure is formed in the deposition window, and a thickness of the electrical connection layer is less than that of the second isolation layer.

In some implementations of the foregoing fabrication method, before the step of forming an electrical connection portion in the connection window and forming an electrical connection layer in the deposition window, the fabrication method may further include:
- removing an oxide film layer in a designated region of the connection structure, where the designated region is a region exposed by the connection window.

In some implementations of the foregoing fabrication method, the fabricating a superconducting Josephson junction and a connection structure of the superconducting Josephson junction on a substrate may include:
- forming a metal layer on the substrate;
- patterning the metal layer, so as to obtain the connection structure, a junction region and a ground region;
- sequentially forming a first electrode, an oxide film layer, and a second electrode on the substrate of the junction region, so that the first electrode being electrically connected to the connection structure and the second electrode being connected to the ground region; and
- obtaining the superconducting Josephson junction at an overlapping position of the first electrode, the oxide film layer, and the second electrode.

In some implementations of the foregoing fabrication method, the forming an electrical connection portion in the connection window and forming an electrical connection layer in the deposition window may include:
- forming, by means of a metal deposition process, a deposition material layer based on defining functions of the connection window and the deposition window.

The deposition material layer includes the electrical connection portion in the connection window and the electrical connection layer in the deposition window.

In some other implementations of the present application, a test method for a quantum chip is provided. The test method for a quantum chip may include:
- providing a quantum chip test structure disposed in a test device, where the quantum chip test structure may be the quantum chip test structure described above, or may be a quantum chip test structure obtained by using the fabrication method for a quantum chip test structure described above; and
- performing an electrical test on a superconducting Josephson junction by directly contacting an electrical connection element of the test device with the electrical connection layer.

In some other implementations of the present application, a fabrication method for a quantum chip is provided. The fabrication method for a quantum chip may include the test method for a quantum chip described above, and after testing is completed, the fabrication method may include:
- peeling off and removing the first isolation layer and the second isolation layer, as well as the electrical connection layer and the electrical connection portion.

Compared with the related art, in the present application, a first isolation layer and a second isolation layer are formed on a connection structure of a superconducting Josephson junction, a connection window penetrating through the first isolation layer is formed in the first isolation layer, and a deposition window configured to define a deposition region that is located on the first isolation layer is formed in the second isolation layer. The electrical connection portion and the electrical connection layer are respectively formed based on defining functions of the connection window and the deposition window that are connected to each other, so that the electrical connection layer is connected to the connection structure of the superconducting Josephson junction through the electrical connection portion. By means of the electrical connection layer in the quantum chip test structure, electrical contact with a test device is implemented, preventing the connection structure of the superconducting Josephson junction from damaging caused by direct contact between the connection structure and the test device. The quantum chip test structure of the present application also helps improve test efficiency of a quantum chip.

BRIEF DESCRIPTION OF THE DRAWINGS

In FIG. 2, (I) is a schematic diagram of a superconducting Josephson junction in FIG. 1 and a connection structure of the superconducting Josephson junction, and (II) is an enlarged schematic diagram of the superconducting Josephson junction in (I).

It should be noted that, one or more embodiments of the present application are used as examples for description through figures in corresponding accompanying drawings. These example descriptions impose no limitation on the embodiments. Unless otherwise stated, the figures in the accompanying drawings impose no limitation on a scale.

DETAILED DESCRIPTION OF THE EMBODIMENTS

To make the objectives, technical solutions, and advantages of the embodiments of the present application clearer, the following describes the embodiments of the present application in detail with reference to the accompanying drawings. However, a person of ordinary skill in the art may understand that many technical details are put forward in the embodiments of the present application to make a reader better understand the present application. However, even without the technical details and various changes and modifications on a basis of the following embodiments, the technical solutions claimed in the present application may be implemented. The division of the following embodiments is for convenience of description, and should not constitute any limitation on the specific implementations of the present application, and various embodiments may be mutually referenced on the premise of no contradiction.

In the following description, it should be understood that when a layer (or film), region, pattern or structure is referred to as being "on" a substrate, layer (or film), region, and/or pattern, it may be directly on another layer or substrate, and/or there may be an insertion layer. In addition, it should be understood that when a layer is referred to as being "under" another layer, it may be directly under another layer, and/or there may be one or more insertion layers. In addition, for "on" a layer and "under" a layer, reference may be made to the figures.

Figure 1:
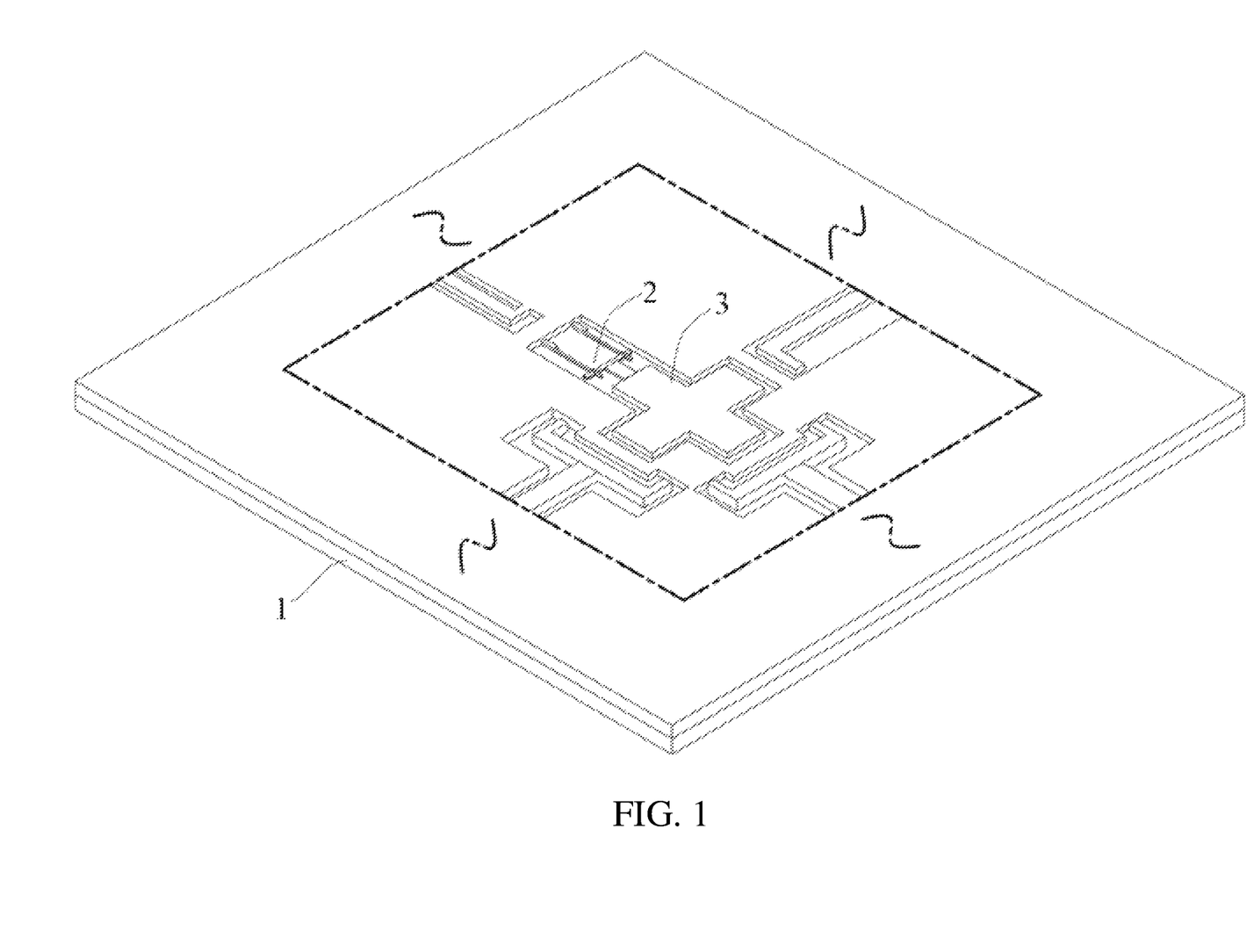
FIG. 1 is a schematic diagram of a quantum chip according to an embodiment of the present application.
Figure 2:
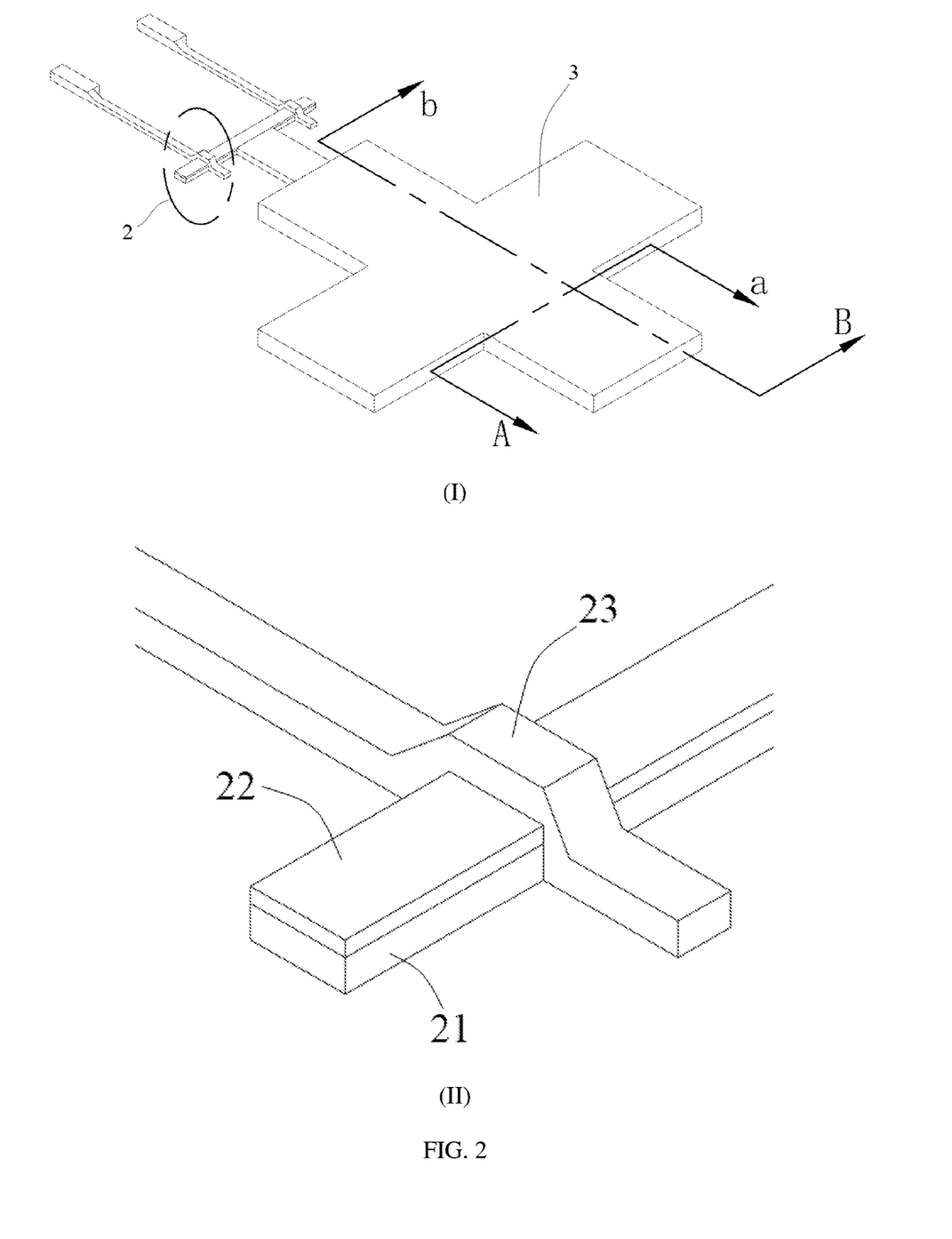

FIG. 1 is a schematic diagram of a quantum chip according to an embodiment of the present application. In FIG. 2, (I) is a schematic diagram of a superconducting Josephson junction 2 in FIG. 1 and a connection structure 3 of the superconducting Josephson junction 2, and (II) is an enlarged schematic diagram of the superconducting Josephson junction 2 in (I). It should be noted that, FIG. 1 schematically represents components or structures located in the dashed box on the quantum chip, for example, positions and shapes and structures of the superconducting Josephson junction 2 and the connection structure 3 of the superconducting Josephson junction 2; and other components or structures except for the superconducting Josephson junction 2 and the connection structure 3 of the superconducting Josephson junction 2 are not shown or only partially illustrated, for example, components or structures outside the dashed box are omitted in FIG. 1.

With reference to FIG. 1 and FIG. 2, for a quantum chip of a superconducting system, the quantum chip is provided with a superconducting Josephson junction 2 and a connection structure 3 of the superconducting Josephson junction 2, and the superconducting Josephson junction 2 and the connection structure 3 are both located on a substrate 1.

It should be noted that FIG. 1 and FIG. 2 are schematic diagrams of shape and structure of an Xmon Qubit, the superconducting Josephson junction 2 is a three-layer structure formed by sequentially stacking on the substrate 1, and the connection structure 3 is a cross-shaped capacitor plate of the Xmon Qubit. Moreover, a superconducting material layer at the lower layer of the superconducting Josephson junction 2 is connected to the cross-shaped capacitor plate, and a superconducting material layer in the superconducting Josephson junction 2 at the top is grounded, for example, connected to a ground region (GND) on the quantum chip. A person skilled in the art should learn that arrangement forms of the superconducting Josephson junction 2 and the connection structure 3 of the superconducting Josephson junction 2 are not limited to that shown in FIG. 1 and FIG. 2, and details are not described herein. A qubit includes a ground capacitor (referring to the connection structure 3 in FIG. 1 to FIG. 3), a superconducting Josephson junction connected in parallel with the ground capacitor, and a control signal line.

The Xmon Qubit shown in FIG. 1 and FIG. 2 is used as an example. In order to implement an electrical contact test on the superconducting Josephson junction 2, the superconducting Josephson junction 2 must be introduced into a test circuit, while the superconducting Josephson junction 2 overall has a small size and area, for example, length and width of about 200 nm. However, a size of an electrical connection element of a test device is relatively much larger, for example, a diameter of a probe is about a few microns. Thus, there is a great difficulty in introducing the superconducting Josephson junction 2 into the test circuit. In view of this, the applicant proposes a quantum chip test structure and a fabrication method and a test method therefor, so as to implement an electrical contact test on a superconducting Josephson junction.

In some embodiments of the present application, a quantum chip test structure is provided, and implementation details of the quantum chip test structure provided in the embodiments are specifically described below. The following content is merely the implementation details provided for ease of understanding, and is not necessary for implementation of the solution.

Figure 3:
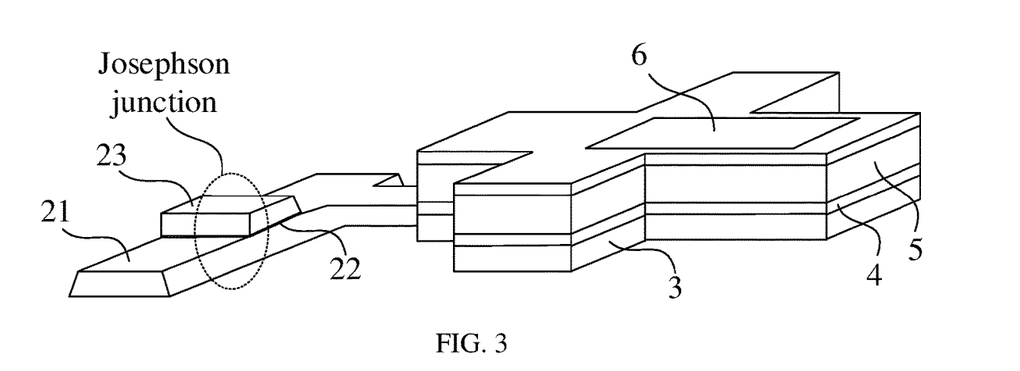
FIG. 3 is a schematic diagram of a quantum chip test structure according to an embodiment of the present application.

FIG. 3 is a schematic diagram of a quantum chip test structure according to an embodiment of the present application, where a substrate 1 is not shown in FIG. 3, and a first electrode 21, an oxide film layer 22, and a second electrode 23 are partially illustrated in FIG. 3. Therefore, it may be understood that shapes and structures of a superconducting Josephson junction 2 and a connection structure 3 of the superconducting Josephson junction 2 in FIG. 3 may be simplified illustration of the superconducting Josephson junction 2 and the connection structure 3 of the superconducting Josephson junction 2 in FIG. 1 and FIG. 2.

Referring to FIG. 3, and with reference to FIG. 1, FIG. 2, and FIG. 4 to FIG. 7, a quantum chip test structure is provided, including:

a superconducting Josephson junction 2 located on a substrate 1 and a connection structure 3 of the superconducting Josephson junction 2, where in some implementations, the connection structure 3 is made of a superconducting material, for example, the superconducting material includes one of TiN, Nb, NbTiN, Al, or Ta, and the superconducting Josephson junction 2 is a structure formed by sandwiching a very thin oxide film layer (thickness≤coherence length of a Cooper electron pair) between two superconducting material layers, for example, a superconducting material layer (S)-semiconductor or insulator material layer (I)-superconducting material layer (S) structure; with reference to FIG. 1, FIG. 2, and FIG. 3, the superconducting Josephson junction 2 is formed by a three-layer structure in which an overlapping position of a first electrode 21, an oxide film layer 22, and a second electrode 23 is S-I-S, it may be understood that the first electrode 21 is integrally formed with a first superconducting material layer of the superconducting Josephson junction 2 to implement an electrical connection, and the second electrode 23 is integrally formed with a second superconducting material layer of the superconducting Josephson junction 2 to implement an electrical connection; during fabrication of the superconducting Josephson junction 2, the first electrode 21, the oxide film layer 22, and the second electrode 23 may be sequentially formed on the substrate 1 to obtain the superconducting Josephson junction 2 at the overlapping position; and with reference to FIG. 1 to FIG. 3, in this embodiment, the connection structure 3 of the superconducting Josephson junction 2 is a cross-shaped capacitor plate of an Xmon Qubit, and it should be noted that a connection structure of the superconducting Josephson junction 2 may be an electrode integrally formed with a corresponding superconducting material layer or formed by extending the superconducting material layer, or may be another electrical structure connected to the superconducting Josephson junction 2, such as a capacitor, or a pad/interface;

a first isolation layer 4 located on the connection structure 3, where a connection window 41 penetrating through the first isolation layer 4 is formed in the first isolation layer 4; and     specifically, the connection window 41 may be a through hole provided in the first isolation layer 4, one end of the through hole extends to a surface of the connection structure 3, and in some implementations of this embodiment, an area of the connection window 41 does not exceed 2 $\mu m^2$;

a second isolation layer 5 located on the first isolation layer 4, where a deposition window 51 is formed on the second isolation layer 5, the deposition window 51 is configured to define a deposition region that is located on the first isolation layer 4, that is, it may be understood that the deposition region on the first isolation layer 4 is exposed through the deposition window 51, and the connection window 41 is connected to the deposition window 51; and     an electrical connection portion 61 located in the connection window 41 and an electrical connection layer 62 located in the deposition window 51, where the electrical connection portion 61 has one end connected to the connection structure 3 and the other end connected to the electrical connection layer 62, and the electrical connection layer 62 is configured to implement electrical contact with a test device; for example, in some implementations of this embodiment, the electrical connection layer 62 and the electrical connection portion 61 are made of an easily peeling-off conductive material, the easily peeling-off conductive material has good electrical conductivity so as to form an electrical connection and is easy to peel off from the connection structure 3, for example, the easily peeling-off conductive material includes one of Al and Ze, and the easily peeling-off conductive material in the present application is not limited thereto as long as the material is readily peeled off with respect to the connection structure 3; and in order to facilitate removal of the electrical connection portion 61 and the electrical connection layer 62 later without damaging the connection structure 3, a material of the connection structure 3 may be Nb, and materials of the electrical connection portion 61 and the electrical connection layer 62 may be selected as Al.

It should be noted that the deposition region defined by the deposition window 51 may be any region on the first isolation layer 4 as long as the connection window 41 is connected to the deposition window 51, and a one-time metal deposition process is used, so that the electrical connection portion 61 can be formed based on a defining function of the connection window 41 on the connection structure 3, the electrical connection layer 62 is formed based on a defining function of the deposition window 51 on the first isolation layer 4, and the electrical connection portion 61 and the electrical connection layer 62 are electrically connected.

In order to facilitate production and fabrication of the quantum chip test structure, and avoid a case that the electrical connection layer 62 is electrically connected to another component or structure on the quantum chip during production and fabrication to affect an electrical test on the superconducting Josephson junction 2, the deposition window 51 is formed with an undercut structure, and a thickness of the electrical connection layer 62 is less than that of the second isolation layer 5, thereby ensuring that the electrical connection layer 62 does not adhere to a residual material layer 63 covering another component or structure while implementing electrical connection with the connection structure 3 through the electrical connection portion 61.

Figure 5:
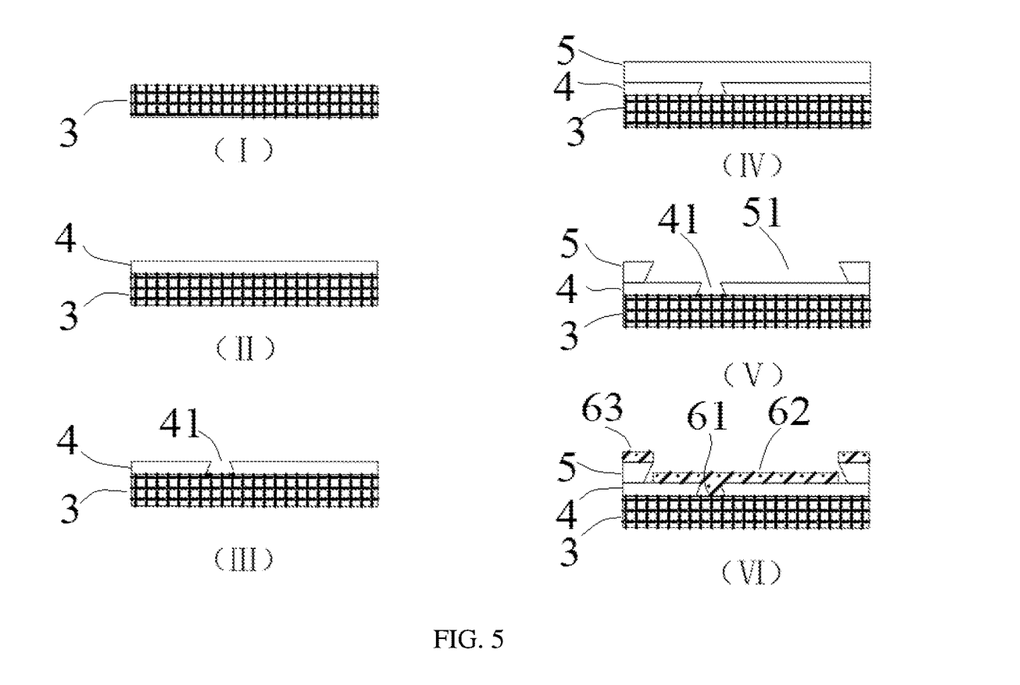
FIG. 5 is a schematic diagram showing Aa cross-section change in a fabrication process of a quantum chip test structure according to an embodiment of the present application.
Figure 6:
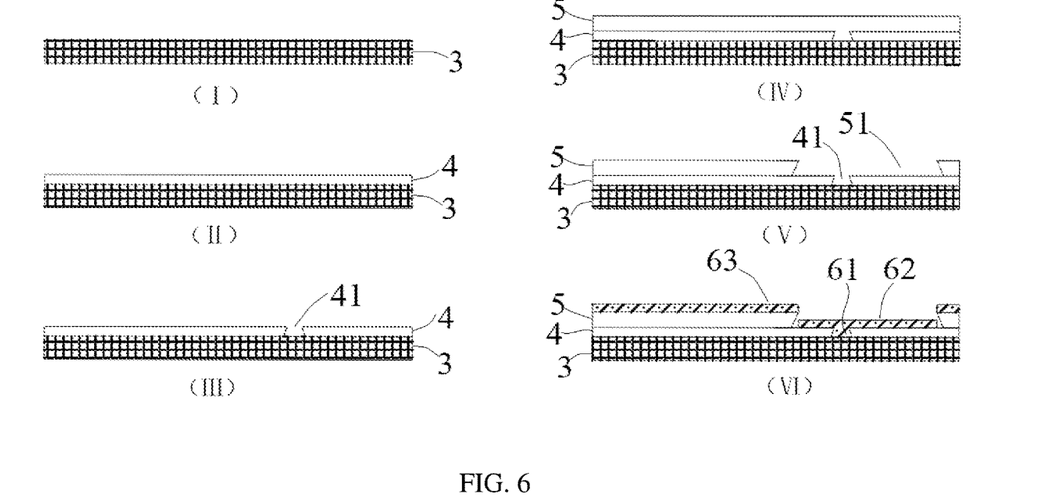
FIG. 6 is a schematic diagram showing Bb cross-section change in a fabrication process of a quantum chip test structure according to an embodiment of the present application.
Figure 7:
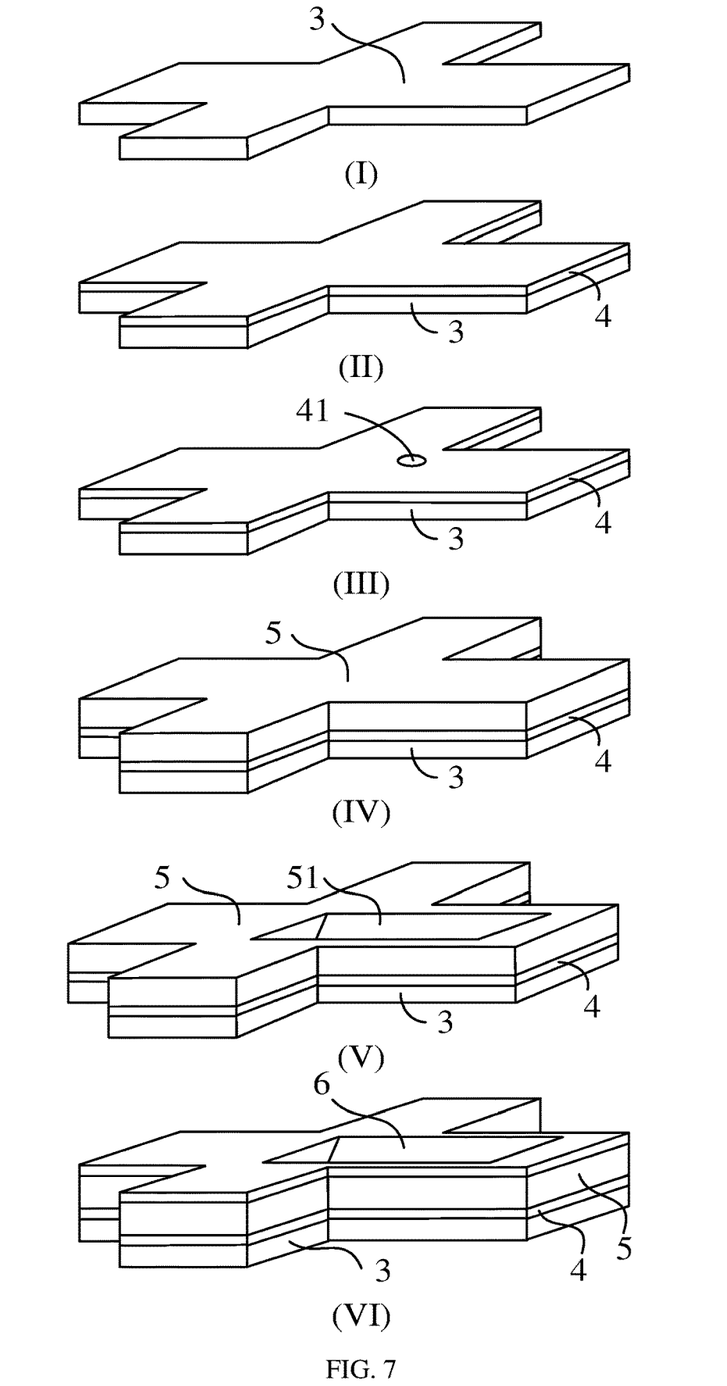
FIG. 7 is a flowchart of a manufacturing process of a quantum chip test structure from a three-dimensional viewing angle of a connection structure 3 according to an embodiment of the present application.

In some implementations of the embodiments of the present application, in order to facilitate peeling off and removal of the first isolation layer 4 and the second isolation layer 5 in the later period, the first isolation layer 4 and the second isolation layer 5 are made of at least one of a photoresist and an electron beam resist. In an implementation, the first isolation layer 4 is formed with polymethyl methacrylate (PMMA), and the second isolation layer 5 is formed through photoresist S1813. The connection window 41 meeting a process size requirement may be formed by applying the photoresist S1813 on the connection structure 3, and then performing exposure and development; and the deposition window 51 may be formed by applying the electron beam resist PMMA on the first isolation layer 4, and then performing exposure and development. The deposition window 51 may be formed with an undercut structure by controlling exposure and development processes. With reference to FIG. 5 and FIG. 6, an undercut structure, also referred to as an undercutting structure or undercut, means that an aperture of the deposition window 51 at a position close to the first isolation layer 4 is greater than that at a position away from the first isolation layer 4, so that the deposition window 51 has an inwardly inclined surface.

In the related art, an electrical contact method cannot be used to test electrical parameters of the superconducting Josephson junction 2, which brings a great trouble to the production and manufacturing. However, in the embodiments of the present application, the first isolation layer 4 is formed on the connection structure 3 of the superconducting Josephson junction 2, the second isolation layer 5 is formed on the first isolation layer 4, and the connection window 41 penetrating through the first isolation layer 4 is formed in the first isolation layer 4, and the deposition window 51 configured to define a deposition region that is located on the first isolation layer 4 is formed on the second isolation layer 5. The electrical connection portion 61 and the electrical connection layer 62 are respectively formed based on defining functions of the connection window 41 and the deposition window 51 that are connected to each other, so that the electrical connection layer 62 is connected to the connection structure 3 of the superconducting Josephson junction 2 through the electrical connection portion 61. By means of the electrical connection layer 62 in the quantum chip test structure, electrical contact with the test device is implemented, avoiding a case that a performance parameter of a qubit is affected due to damage caused by direct contact between the connection structure 3 of the superconducting Josephson junction 2 and the test device. The quantum chip test structure of the present application also helps improve test efficiency of a quantum chip.

In the embodiments provided in the present application, the first isolation layer 4, the second isolation layer 5, the electrical connection portion 61, and the electrical connection layer 62 are made of an easily peeling-off material, and may be easily peeled off and removed after testing, and an impact on performance of the superconducting Josephson junction 2 and another component or structure on the quantum chip is very small. For example, when the connection structure 3 is made of Al, and an area of the connection window is no more than 2 $\mu m^2$, the electrical connection portion 61 and the electrical connection layer 62 are formed by depositing metal Al based on defining functions of the connection window 41 and the deposition window 51. After test of the quantum chip is completed, the first isolation layer 4 and the second isolation layer 5 may be peeled off and removed together with the electrical connection layer 62 and the electrical connection portion 61 through a washing process, without needing to separately fabricate a peeling-off solution reagent or to set a separate peeling-off process step for the electrical connection portion 61 and the electrical connection layer 62.

It should be noted that the foregoing exemplary implementations are to further optimize some details in this embodiment.

In some other embodiments of the present disclosure, a fabrication method for a quantum chip test structure is provided. The implementation details of the fabrication method for a quantum chip test structure provided in the embodiments are specifically described below. The following content is merely the implementation details provided for ease of understanding, and is not necessary for implementation of the solution. In this embodiment, reference may be made to FIG. 4 to FIG. 7, and in combination with FIG. 1 to FIG. 3, in order to distinguish the display, different filling patterns are selected in FIG. 5 and FIG. 6 for distinguishing.

Figure 4:
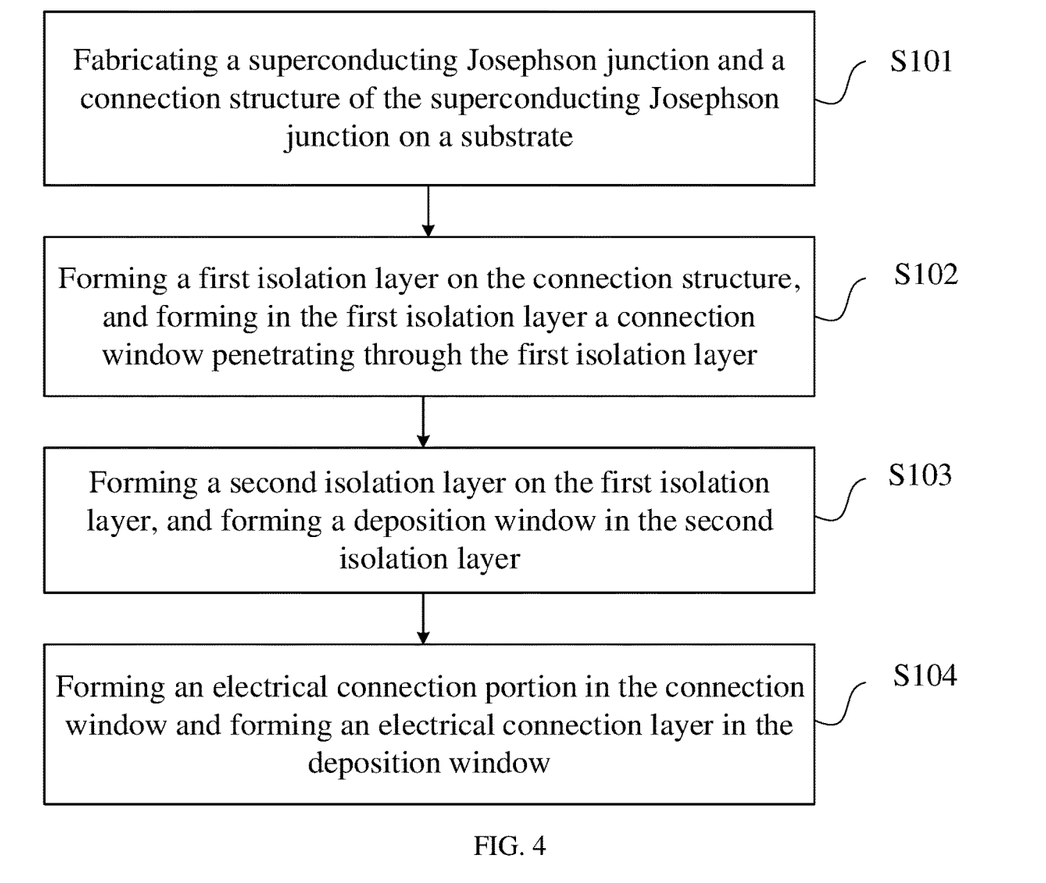
FIG. 4 is a flowchart of a fabrication method for a quantum chip test structure according to an embodiment of the present application.

A fabrication method for a quantum chip test structure is provided, including the following steps.

S101: Fabricating a superconducting Josephson junction 2 on a substrate 1 and a connection structure 3 of the superconducting Josephson junction 2. Specifically, first, a metal layer is formed on the substrate 1, where a material of the metal layer may be selected from Nb, Al, and the like, and the metal layer is formed by Al in this embodiment of the present application; then, the metal layer is patterned to obtain the connection structure 3, a junction region, a ground region (GND), a control signal line, and the like; and finally, a first electrode 21, an oxide film layer 22, and a second electrode 23 are sequentially formed on the substrate 1 of the junction region by using a coating process, the first electrode 21 is electrically connected to the connection structure 3, the second electrode 23 is connected to the ground region, and the superconducting Josephson junction 2 is obtained at an overlapping position of the first electrode 21, the oxide film layer 22, and the second electrode 23. During specific implementation, the method for fabricating the superconducting Josephson junction 2 and the connection structure 3 of the superconducting Josephson junction 2 on the substrate 1 is not limited thereto.

S102: Forming a first isolation layer 4 on the connection structure 3, and forming in the first isolation layer 4 a connection window 41 penetrating through the first isolation layer 4. For example, based on a photolithography process, photoresist, electron beam resist, or the like is coated on the connection structure 3 to form the first isolation layer 4 made of the photoresist or electron beam resist, and then exposure and development are performed to form the connection window 41 penetrating through the first isolation layer 4. Optionally, an area of the formed connection window does not exceed 2 $\mu m^2$.

S103: Forming a second isolation layer 5 on the first isolation layer 4, and forming a deposition window 51 in the second isolation layer 5, where the deposition window 51 is configured to define a deposition region that is located on the first isolation layer 4, and the connection window 41 is connected to the deposition window 51. Similar to a method for forming the first isolation layer 4 and the connection window 41, the second isolation layer 5 and the deposition window 51 may be formed based on a photolithographic process. This step differs from S102 in that an area of a deposition region formed after exposure and development is not less than a contact area of an electrical connection element of a test device to facilitate contact of the electrical connection element.

S104: Forming an electrical connection portion 61 in the connection window 41 and forming an electrical connection layer 62 in the deposition window 51, where the electrical connection portion 61 has one end connected to the connection structure 3 and the other end connected to the electrical connection layer 62, and the electrical connection layer 62 is configured to implement electrical contact with the test device. As an implementation of this step, a deposition material layer 6 may be formed by means of a metal deposition process and based on defining functions of the connection window 41 and the deposition window 51. The deposition material layer 6 includes the electrical connection portion 61 located in the connection window 41 and the electrical connection layer 62 located in the deposition window 51. It may be understood that the electrical connection layer 62 is located on the deposition region defined by the deposition window 51, and a thickness of the electrical connection layer 62 may be controlled by means of the metal deposition process.

With regard to material selection of the first isolation layer 4, the second isolation layer 5, the electrical connection portion 61, and the electrical connection layer 62, reference may be made to the foregoing embodiments of the quantum chip test structure.

In the related art, an electrical contact method cannot be used to test electrical parameters of the superconducting Josephson junction 2, which brings a great trouble to the production and manufacturing. However, in the embodiments of the present application, the first isolation layer 4 is formed on the connection structure 3 of the superconducting Josephson junction 2, and the connection window 41 penetrating through the first isolation layer 4 is formed in the first isolation layer 4; then the second isolation layer 5 is formed on the first isolation layer 4, and the deposition window 51 configured to define a deposition region that is located on the first isolation layer 4 is formed in the second isolation layer 5; and finally, the electrical connection portion 61 and the electrical connection layer 62 are respectively formed based on defining functions of the connection window 41 and the deposition window 51 that are connected to each other, so that the electrical connection layer 62 is connected to the connection structure 3 of the superconducting Josephson junction 2 through the electrical connection portion 61. By means of the electrical connection layer 62 in the quantum chip test structure, electrical contact with the test device is implemented, preventing the connection structure 3 of the superconducting Josephson junction 2 from damage caused by direct contact between the connection structure 3 and the test device. The quantum chip test structure of the present application also helps improve test efficiency of a quantum chip.

In the embodiments provided in the present application, the first isolation layer 4, the second isolation layer 5, the electrical connection portion 61, and the electrical connection layer 62 are made of an easily peeling-off material, and may be easily peeled off and removed after testing, and an impact on performance of the superconducting Josephson junction 2 and another component on the quantum chip is very small. For example, when the connection structure 3 is made of Al and an area of the connection window is no more than 2 um$^2$, the electrical connection portion 61 and the electrical connection layer 62 are formed by depositing metal Al based on defining functions of the connection window 41 and the deposition window 51, and after a test of the quantum chip is completed, the first isolation layer 4 and the second isolation layer 5, as well as the electrical connection layer 62 and the electrical connection portion 61 may be peeled off and removed through a washing process.

In addition, in a specific implementation process, some details in this embodiment may be further optimized, and examples are as follows.

In some implementations of this embodiment, in order to ensure accuracy of a test for the quantum chip, and reduce an impact of an oxide layer on an electrical connection and electrical test, if an oxide film layer is formed on the connection structure 3, before the step S104 of forming an electrical connection portion 61 in the connection window 41 and forming an electrical connection layer 62 in the deposition window 51, the method further includes:

removing an oxide film layer in a designated region of the connection structure 3, where the designated region is a region exposed by the connection window 41; and specifically, when the connection structure 3 is made of Al, the oxide film layer in a region, exposed by the connection window 41, on the connection structure 3 may be removed by using an ion beam etching (IBE) process.

In some other implementations of this embodiment, in order to avoid an impact on an electrical test for the superconducting Josephson junction 2 caused by adhesion of the electrical connection layer 62 to a residual material layer 63 (the residual material layer 63 formed by using a deposition process is extremely easy to directly cover another component or structure of the quantum chip to form an electrical connection with the another component or structure) when a metal material is deposited to form the electrical connection portion 61 and the electrical connection layer 62, the deposition window 51 is formed with an undercut structure, and a thickness of the formed electrical connection layer 62 is less than that of the second isolation layer 5. The undercut structure is used to block a deposited material and thickness of the second isolation layer 5 is controlled, so as to avoid the impact on the electrical test for the superconducting Josephson junction 2 caused by adhesion of the electrical connection layer 62 to the residual material layer 63.

With regard to formation of the undercut structure, reference may be made to the foregoing embodiments of the quantum chip test structure.

Some other embodiments of the present application provide a test method for a quantum chip, and the test method for a quantum chip may be performed on the basis of the foregoing embodiments of the quantum chip test structure and/or the foregoing embodiments of the fabrication method for a quantum chip test structure, where descriptions of the same or similar parts are omitted. The implementation details of the embodiments are specifically described below, and the following content is merely the implementation details provided for ease of understanding, and is not necessary for implementation of the solution. With reference to the flowchart shown in FIG. 8, a test method for a quantum chip according to an embodiment includes the following steps.

Figure 8:
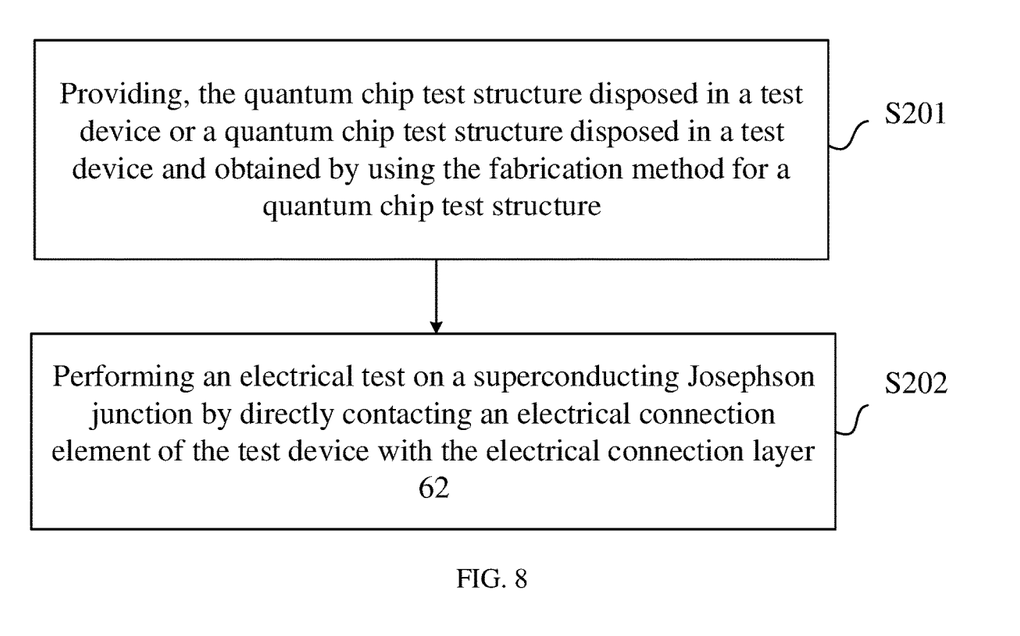
FIG. 8 is a flowchart of a test method for a quantum chip according to an embodiment of the present application.

S201: Providing a quantum chip test structure disposed in a test device, where the quantum chip test structure is the quantum chip test structure according to the foregoing embodiments, or is a quantum chip test structure obtained by using the fabrication method for a quantum chip test structure according to the foregoing embodiments.

For example, the test device may include a probe station and a lock-in amplifier.

S202: Performing an electrical test on a superconducting Josephson junction 2 by directly contacting an electrical connection element (such as a probe) of the test device with the electrical connection layer 62.

Specifically, a quantum chip test structure that has been fabricated and has the electrical connection layer 62 is placed on a probe station, the electrical connection layer 62 is electrically connected to a lock-in amplifier through direct contact between a probe and the electrical connection layer 62, and the lock-in amplifier and the quantum chip are in a common ground connection. Thus, the superconducting Josephson junction 2 and the connection structure 3 of the superconducting Josephson junction 2 are connected to a test circuit to obtain a test feedback signal by using the lock-in amplifier, so as to implement a contact test of the quantum chip. A manner of common ground connection between the lock-in amplifier and the quantum chip may be implemented by directly contacting the probe with a ground region (GND) on the quantum chip to implement connection of a ground terminal of the lock-in amplifier, or by forming an electrical structure on the ground region (GND) to implement indirect contact.

Therefore, in the present application, a contact test of a superconducting Josephson junction is implemented, and a test process is optimized, making the test convenient, efficient, and accurate.

In the embodiment, the first isolation layer 4 and the second isolation layer 5 are sequentially formed on the connection structure 3 of the superconducting Josephson junction 2; in addition, the connection window 41 penetrating through the first isolation layer 4 is formed in the first isolation layer 4, and the deposition window 51 configured to define a deposition region that is located on the first isolation layer 4 is formed in the second isolation layer 5. The electrical connection portion 61 and the electrical connection layer 62 are respectively formed based on defining functions of the connection window 41 and the deposition window 51 that are connected to each other, so that the electrical connection layer 62 is connected to the connection structure 3 of the superconducting Josephson junction 2 through the electrical connection portion 61. By means of the electrical connection layer 62 in the quantum chip test structure, electrical contact with the test device is implemented, preventing the connection structure 3 of the superconducting Josephson junction 2 from damaging caused by direct contact between the connection structure 3 and the test device. The quantum chip test structure of the present application also helps improve test efficiency of a quantum chip.

In the embodiments provided in the present application, the first isolation layer 4, the second isolation layer 5, the electrical connection portion 61, and the electrical connection layer 62 are made of an easily peeling-off material, and may be easily peeled off and removed after testing, and an impact on performance of the superconducting Josephson junction 2 and another component on the quantum chip is very small. For example, when the connection structure 3 is made of Al and an area of the connection window is no more than 2 um², the electrical connection portion 61 and the electrical connection layer 62 are formed by depositing metal Al based on defining functions of the connection window 41 and the deposition window 51, and after a test of the quantum chip is completed, the first isolation layer 4 and the second isolation layer 5, as well as the electrical connection layer 62 and the electrical connection portion 61 may be peeled off and removed through a washing process.

Some other embodiments of the present application provide a fabrication method for a quantum chip, and the fabrication method for a quantum chip may be performed based on the foregoing embodiments of the test method for a quantum chip, and descriptions of the same or similar parts are omitted. The implementation details of the embodiments are specifically described below, and the following content is merely the implementation details provided for ease of understanding, and is not necessary for implementation of the solution.

The test method for a quantum chip includes the fabrication method for a quantum chip described in the foregoing embodiments. After the testing is completed, the test method for a quantum chip includes the following step:

peeling off and removing the first isolation layer 4 and the second isolation layer 5, as well as the electrical connection portion 61 and the electrical connection layer 62.

Specifically, for example, in a quantum chip test structure in an embodiment of the present application, the connection structure 3, the electrical connection portion 61, and the electrical connection layer 62 are made of Al, and an area of the connection window 41 is no more than 2 μm²; and the first isolation layer 4 is made of PMMA, and the second isolation layer 5 is made of photoresist S1813. After testing is completed, the quantum chip test structure is successively subjected to N-methyl pyrrolidone (nmp) solution soaking, isopropyl alcohol (IPA) solution soaking, and ultrasonic vibration, so that the first isolation layer and the second isolation layer, as well as the electrical connection layer and the electrical connection portion may be peeled off and removed, and then the quantum chip is obtained by blowing dry with nitrogen gas.

In order to facilitate the subsequent removal of the electrical connection portion 61 and the electrical connection layer 62 without damaging the connection structure 3, the connection structure 3 may be made of Nb, the electrical connection portion 61 and the electrical connection layer 62 may be made of Al, and a tetramethyl ammonium hydroxide (TMAH) solution selected for the peeling-off and removal process causes no damage to the connection structure 3 made of Nb. It should be noted that, even if the connection structure 3, the electrical connection portion 61, and the electrical connection layer 62 are all made of Al, during peeling-off and removal of the electrical connection portion 61 and the electrical connection layer 62, due to protection of the connection structure 3 from the first isolation layer 4 and the second isolation layer 5 and control of an area of a connection window at earlier stage, the first isolation layer 4, the second isolation layer 5, as well as the electrical connection layer 62 and the electrical connection portion 61 may be directly peeled off and removed from the quantum chip by using a washing process. Furthermore, an impact of the peeling-off and removal process on the connection structure 3 is also very small, and thus an impact on performance (such as coherence time) of the quantum chip is also very small, even may be negligible.

The constructions, features and functions of the present application are described in detail in the embodiments with reference to the accompanying drawings. The foregoing is merely preferred embodiments of the present application, and the present application is not limited by the accompanying drawings. All equivalent embodiments that are modified or changed according to the concept of the present application and do not depart from the spirit of the description and the drawings should fall within the protection scope of the present application.

What is claimed is:

1. A quantum chip test structure, comprising:
 a superconducting Josephson junction and a connection structure of the superconducting Josephson junction that are located on a substrate;
 a first isolation layer located on the connection structure, wherein a connection window penetrating through the first isolation layer is formed in the first isolation layer;
 a second isolation layer located on the first isolation layer, wherein a deposition window is formed in the second isolation layer, the deposition window is configured to define a deposition region that is located on the first isolation layer, and the connection window is connected to the deposition window, the first isolation layer and the second isolation layer are made of at least one of a photoresist and an electron beam resist; and
 an electrical connection portion located in the connection window and an electrical connection layer located in the deposition window, wherein the electrical connection portion has one end connected to the connection structure and the other end connected to the electrical connection layer.

2. The quantum chip test structure according to claim 1, wherein an undercut structure is formed in the deposition window, and a thickness of the electrical connection layer is less than that of the second isolation layer.

3. The quantum chip test structure according to claim 1, wherein the connection structure is made of a superconducting material.

4. The quantum chip test structure according to claim 1, wherein the electrical connection layer and the electrical connection portion are made of Al.

5. The quantum chip test structure according to claim 1, wherein the superconducting Josephson junction is a structure formed by sandwiching an oxide film layer between two superconducting material layers.

6. The quantum chip test structure according to claim 5, wherein the connection structure is an electrical structure connected to the superconducting Josephson junction.

7. The quantum chip test structure according to claim 1, wherein the connection window is a through-hole formed in the first isolation layer, and one end of the through-hole extends to a surface of the connection structure.

8. A fabrication method for a quantum chip test structure according to claim 1, comprising:
fabricating a superconducting Josephson junction and a connection structure of the superconducting Josephson junction on a substrate;
forming a first isolation layer on the connection structure, and forming in the first isolation layer a connection window penetrating through the first isolation layer;
forming a second isolation layer on the first isolation layer, and forming a deposition window in the second isolation layer, wherein the deposition window is configured to define a deposition region that is located on the first isolation layer, and the connection window is connected to the deposition window, the first isolation layer and the second isolation layer are made of at least one of a photoresist and an electron beam resist; and
forming an electrical connection portion in the connection window and forming an electrical connection layer in the deposition window, wherein the electrical connection portion has one end connected to the connection structure and the other end connected to the electrical connection layer.

9. The fabrication method according to claim 8, wherein the formed deposition window has an undercut structure, and a thickness of the electrical connection layer is less than that of the second isolation layer.

10. The fabrication method according to claim 8, wherein before the step of forming an electrical connection portion in the connection window and forming an electrical connection layer in the deposition window, the fabrication method further comprises:
removing an oxide film layer in a designated region of the connection structure, wherein the designated region is a region exposed by the connection window.

11. The fabrication method according to claim 8, wherein the fabricating a superconducting Josephson junction and a connection structure of the superconducting Josephson junction on a substrate comprises:
forming a metal layer on the substrate;
patterning the metal layer, so as to obtain the connection structure, a junction region and a ground region;
sequentially forming a first electrode, an oxide film layer, and a second electrode on the substrate of the junction region, so that the first electrode being electrically connected to the connection structure and the second electrode being connected to the ground region; and
obtaining the superconducting Josephson junction at an overlapping position of the first electrode, the oxide film layer, and the second electrode.

12. The fabrication method according to claim 8, wherein the forming an electrical connection portion in the connection window and forming an electrical connection layer in the deposition window comprises:
forming, by means of a metal deposition process, a deposition material layer based on defining functions of the connection window and the deposition window, wherein
the deposition material layer comprises the electrical connection portion in the connection window and the electrical connection layer in the deposition window.

13. A test method for a quantum chip, comprising:
providing a quantum chip test structure disposed in a test device, wherein the quantum chip test structure is the quantum chip test structure according to claim 1; and
performing an electrical test on a superconducting Josephson junction by directly contacting an electrical connection element of the test device with the electrical connection layer.

14. A test method for a quantum chip, comprising:
providing a quantum chip test structure disposed in a test device, wherein the quantum chip test structure is obtained by using the fabrication method for a quantum chip test structure according to claim 8; and
performing an electrical test on a superconducting Josephson junction by directly contacting an electrical connection element of the test device with an electrical connection layer.

15. A fabrication method for a quantum chip, comprising the test method for a quantum chip according to claim 13, wherein after testing is completed, the fabrication method comprises:
peeling off and removing the first isolation layer and the second isolation layer, as well as the electrical connection layer and the electrical connection portion.

16. A fabrication method for a quantum chip, comprising the test method for a quantum chip according to claim 14, wherein after testing is completed, the fabrication method comprises:
peeling off and removing a first isolation layer and a second isolation layer, as well as an electrical connection layer and an electrical connection portion.

* * * * *